United States Patent [19]
Brunfeldt et al.

[11] Patent Number: 5,307,284
[45] Date of Patent: Apr. 26, 1994

[54] VECTOR NETWORK ANALYZER

[75] Inventors: David R. Brunfeldt; Somnath Mukherjee, both of Lawrence, Kans.

[73] Assignee: Applied Microwave Corporation, Lawrence, Kans.

[21] Appl. No.: 936,924

[22] Filed: Aug. 27, 1992

Related U.S. Application Data

[63] Continuation of Ser. No. 441,568, Nov. 24, 1989, abandoned.

[51] Int. Cl.⁵ .................... G01R 23/00; G01R 23/175
[52] U.S. Cl. .................................... 364/485; 364/487; 324/76.39; 324/76.13
[58] Field of Search ............... 364/485, 487, 571.01; 324/77 R, 77 B, 77 C; 371/22.4, 27

[56] References Cited

U.S. PATENT DOCUMENTS

| | | | |
|---|---|---|---|
| 4,578,638 | 3/1986 | Takano et al. | 324/77 R |
| 4,685,065 | 8/1987 | Braun et al. | 364/485 |
| 4,703,433 | 10/1987 | Sharrit | 364/485 |
| 4,858,160 | 8/1989 | Strid et al. | 364/571.01 |

Primary Examiner—Vincent N. Trans
Attorney, Agent, or Firm—Kenneth W. Iles

[57] ABSTRACT

A vector network analyzer utilizes a single voltage controlled oscillator to produce a sweep frequency over time, which is supplied to a device under test. The return signal from the device under test is delayed and mixed with the original signal to produce an intermediate frequency signal that is digitized and the data manipulated by a computer to measure the reflection coefficient or transmission coefficient of the device under test.

19 Claims, 10 Drawing Sheets

INPUT/OUTPUT—MODULE 1

RAMP SIGNAL DATA GENERATION MODULE 3

ANALYTIC SIGNAL GENERATION MODULE 4

$\hat{y}(n)$ IS THE HILBERT TRANSFORM OF $y(n)$

ARITHMETIC FUNCTIONS MODULE 5

VECTOR NETWORK ANALYZER

CROSS-REFERENCE TO RELATED APPLICATIONS

This application is a continuation of U.S. patent application Ser. No. 07/441,568, filed Nov. 24, 1989, now abandoned.

BACKGROUND OF THE INVENTION

1. Field of the Invention

The present invention is directed to a vector network analyzer. More particularly, the present invention is directed to a vector network analyzer that operates in the microwave frequency range.

2. Description of Related Art

Measuring characteristics and parameters of microwave devices or using microwaves to measure characteristics of things or targets is difficult because at microwave frequencies circuit parameters that do not matter at lower frequencies become important. In addition to the conventional parameters of current and voltage, at the microwave frequencies the additional parameters of electrical and magnetic fields, phase and the physical position of a point of interest within a device become important. Furthermore, current and voltage cannot be directly measured in the microwave portion of the radio frequency spectrum. In addition, it is essential that phase information of the microwave signal be ascertainable. Therefore, special instruments are required to measure characteristics of microwave devices.

A linear electrical network is a number of impedances connected together to form a system that consists of a set of inter-related circuits and that performs specific functions. The behavior of the network depends on the network constants. Networks may be passive, i.e., those that contain no energy source or sink other than normal ohmic losses, or active, which contain an energy source or sink. Microwave circuits may be characterized by many other criteria, e.g., resistance, resistance-capacitance, inductance-capacitance, inductance, lattice structure, bridge structure, series or parallel structure, linear, nonlinear, bilateral, unilateral, etc.

Even more generally, for purposes of this specification, a network is an electrical black box with one or more inputs or outputs, called ports, and may include a network formed between the test device and a target device that may or may not be connected together by conductors. Measurements of microwave circuits and components involve the characterization of the circuit as a network, and measuring the reflection and transmission coefficients of the ports.

Network analyzers are useful for measuring the network characteristics of many electrical systems, such as cables, circuits, and so forth; for ranging, i.e., measuring the distance between the analyzer and objects that reflect microwaves, such as aircraft, buildings, discontinuities in cables, and for many other applications.

Network analyzers can measure the reflection coefficient for any device or target and the transmission coefficient for any electrical device. They must be vector analyzers to recover phase information. Reflection coefficients can be used to determine, among other things, range or distance, whether for guided or unguided propagation. For example, the reflection coefficient can be used to determine the distance from the point of connection to a coaxial cable to a break in the cable, or the distance to a target, such as an airplane in flight. The ability to work with vectors being assumed, the device will hereafter be referred to simply as a network analyzer.

Network analyzers of the prior art require at least one phase locked oscillator to generate the microwave signals they require. The oscillator must be very stable throughout the full range of operating conditions, e.g., temperature. They must produce cw signals that are stepped in frequency. Manufacturing precision oscillators is very tedious and expensive. Manufacturing pairs of precision phase locked oscillators, which are employed in some network analyzers, is even more expensive. In addition, many of the circuit elements of prior art network analyzers must be precision microwave frequency components, which are quite expensive relative to comparable components designed for operation at lower frequencies.

Network analyzers in the prior art are expensive, bulky, heavy, and not portable. These disadvantages have seriously limited their availability and uses.

Accordingly, there is a need for a network analyzer that is relatively inexpensive, compact, portable, does not require two phase locked oscillators, and that does not require precision microwave frequency components.

SUMMARY OF THE INVENTION

Accordingly, it is an object of the present invention to provide a network analyzer that is relatively inexpensive, costing as little as about one-tenth as much as network analyzers of the prior art.

It is a further object of the present invention to provide a network analyzer that is compact and portable.

It is a further object of the present invention to provide a network analyzer that utilizes a single oscillator that produces a sweep of different frequencies during a sweep period, and therefore does not require two phase locked single frequency oscillators.

It is a further object of the present invention to provide a network analyzer that relies on computer software or firmware to process the raw data signals, and processes the signal data in the time domain, or the frequency domain.

The network analyzer comprises four basic circuit portions, which are the radio frequency section, the analog section, the digital section, and the computer section.

In the radio frequency section, the network analyzer produces a repeated linear sweep frequency signal that is split into two equal signals. Each of the two equal signals is transmitted to a separate double balanced mixer having both a local oscillator port and a RF (reference) port that are isolated from one another by about 30–40 dB. The RF port of the first mixer is connected to a delay line in a test channel, which is used to test a desired characteristic of the device under test (DUT), typically the reflection coefficient, or the transmission coefficient. The RF port of the second mixer is connected to a delay line in a reference channel. The reference channel is used for calibration of the system and for periodic addition of a correction factor to the results of the test channel to account for changes in the operating characteristics of the network analyzer itself due to changes in temperature, circuit component value, circuit drift, etc. The reference channel is not used for collecting data from the DUT.

The purpose of having identical test and reference channels that track together is to eliminate the inaccuracies that may arise due to the drift of various parameters.

The delay lines in both the test channel and the reference channel may be known lengths of coaxial cable or other suitable delaying components. Both delay lines exhibit the same signal delay.

The reflection coefficient of the DUT is measured by connecting one end of the DUT to the test channel of the network analyzer and terminating all other ports of the DUT with a matched impedance. The network analyzer can measure the reflection coefficient by using either guided or unguided microwaves.

The transmission coefficient of the DUT is measured by connecting the output terminal of the DUT to the test channel of the network analyzer and the input terminal of the DUT to the J-port of the network analyzer. It is often desirable to provide direct current (DC) bias currents to devices under test. Transistors, PIN diodes and other microwave components are under the influence of a bias condition during actual use. Therefore, such components must be subjected to a similar DC bias during testing to measure the parameters of the circuit accurately. The circuit that applies the bias can be situated near the IF mixers in this network analyzer.

The delay line between the bias network and the DUT provides a means for separating the reflections due to the bias network from the reflections seen from the DUT. Thus, just as we see in the "garbage subtraction" feature discussed below, we can remove the bias network "garbage" and retain the reflections from the DUT.

The transmission coefficient is usually of interest in testing Multiport Microwave Circuits and devices and can be measured by the network analyzer by utilizing the so-called J-port in conjunction with the test channel. The J-port of the network analyzer provides an amplified frequency sweep signal taken from the output of the voltage controlled oscillator (VCO) through a coupler that splits the signal going to the reference channel. No signal leaks back through the coupler from the J-port to the reference delay line. The J-port signal transmits a signal through the DUT to the test channel.

The signal from the reference channel is mixed with the sweep signal from the VCO to produce a reference intermediate frequency (RIF) in the audio frequency range. The signal from the test channel is mixed with the sweep signal from the VCO in a separate mixer to produce a test intermediate frequency (TIF), also in the audio range, when measuring either the reflection coefficient or the transmission coefficient. All signals originate from a single VCO, thus phase coherence is maintained.

In the analog section, the RIF and the TIF signals are conditioned in parallel identical analog circuits, a reference channel circuit for the RIF and a test channel circuit for the TIF. The two channels employ identical analog circuitry. The two signals are amplified, attenuated by programmable digital attenuators, and passed through a high pass filter and a low pass filter to provide two separate, clean, strong analog signals—a reference signal and a test signal.

Next, in the digital section, the two signals are sampled and then multiplexed in the sampler and the multiplexer, and then they are digitized in an analog-to-digital (A/D) converter. The digitized signals are stored in appropriate memory units for transfer to the computer.

The digital section also provides the nonlinear voltage ramp signal that drives the VCO to generate a linear frequency sweep. The data sequence for the ramp is generated in the computer and stored in an appropriate memory device. A signal from a control circuit causes the data in the memory device to flow to a digital-to-analog converter, which produces the actual voltage ramp signal. The signal is smoothed by a low pass filter and transmitted directly to the VCO.

In the digital section, a master clock controlled by a crystal controlled oscillator that is separate from the computer clock synchronizes the processing of the reference channel and test channel signals with the generation of the frequency sweep signal. This synchronization is essential for recovery and measurement of signal phase information.

The computer produces the digital data sequence used to drive the D/A converter and thus, the linear frequency sweep. It also generates the digital control data for setting the switches, attenuators, etc., and it initiates the data acquisition.

The IF signals (both TIF and RIF), which are filtered and synchronously sampled, are functions of $F(t)\tau$, where $F(t)$ is the microwave frequency at time t of the sweep, and $\tau$ is the time delay through the delay line. Two IF channels, reference and test, produce the IF data records RIF and TIF respectively. Calibration involves measuring the signals with a known DUT, typically an open circuit (the reflection coefficient $= +1$) or a through connection (the transmission coefficient $= +1$). Thus, the variables $RIF_c$, $RIF_m$, $TIF_c$, $TIF_m$ correspond to the reference channel measurement during calibration, reference channel measurement during DUT, the test channel measurement during calibration, and the test channel during DUT, respectively. Again, these variables are functions of $F(t)\tau$.

These variables are converted to complex functions of $F(t)\tau$ by the application of the Hilbert transform, or the Fourier transform. Thus, the variables, RIF and TIF contain the network measurements, both as a function of RF frequency and time delay. The RIF signals are used to correct, or normalize, the TIF to account for drift in the circuitry or parameters or the network analyzer between calibration sequences. All the data acquisitions and computations are performed by the computer. Results are stored, displayed and (optionally) printed by the computer.

A major advantage of this technique is the straightforward generation of computer-compatible data. Microwave hardware is minimized while the burden of computation, calibration, etc., lies within the computer. Cost benefit and computational flexibility are thus maximized.

The achievement of these and other objects of the invention will become apparent from the description that follows.

DETAILED DESCRIPTION OF THE PREFERRED EMBODIMENT

The Detailed Description follows the headings as set forth in the text.

I. DESCRIPTION OF THE ELECTRICAL CIRCUITRY

Figure 1:
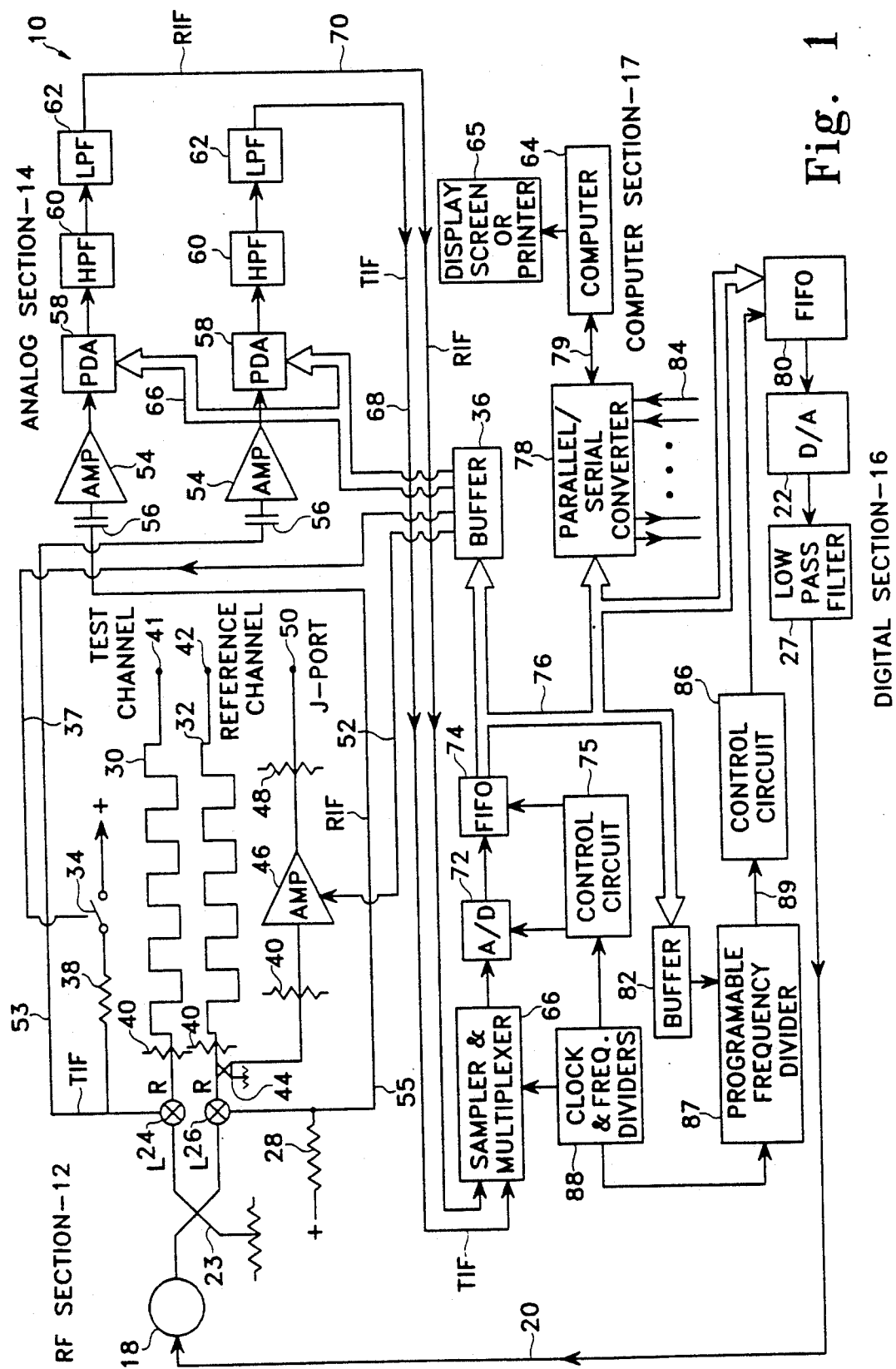
FIG. 1 is a block diagram of the electrical hardware of the network analyzer.

Referring to FIG. 1, there is shown, in block diagram form, the network analyzer 10, including the radio frequency (RF) section 12, the analog section 14, the digital section 16, and the computer section 17. The RF section 12 generates the signals that will test the device under test (DUT), transmits the test signals to the device under test, receives the return signals and mixes the transmitted and received, or returned, signals.

The resulting intermediate frequency (IF) signals are cleaned-up in the analog section 14, sampled, multiplexed, digitized, and stored in the digital section 16, and digitally processed in the computer section 17 to provide the final output information. These circuit sections are discussed in the order listed.

Figure 2:
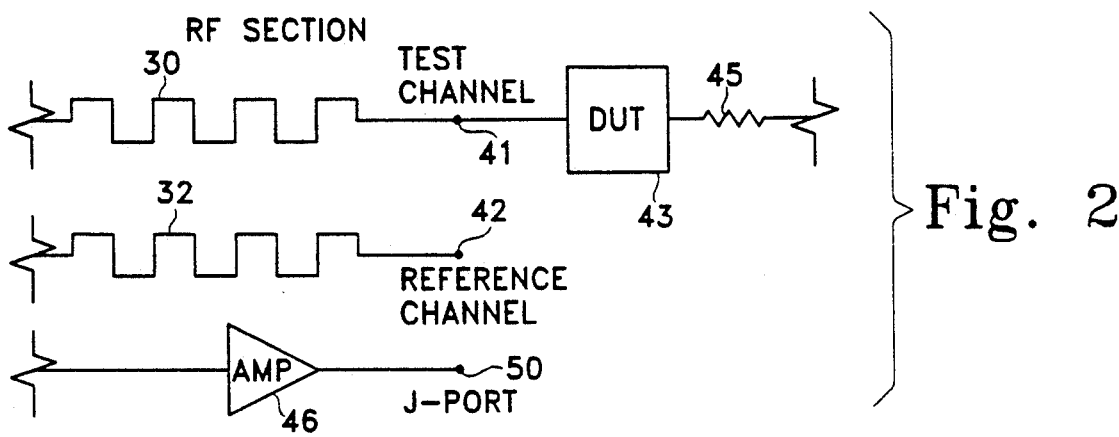
FIG. 2 is a block diagram of the connections made to a device under test to measure the reflection coefficient.

Referring to FIG. 2, the reflection coefficient of a DUT can be determined when one port of the DUT 43 is connected to the test channel 41 and all other ports are terminated by an appropriate impedance 45, which may typically be an impedance of 50 ohms for microwave networks, or 75 ohms for cable television applications.

Figure 3:
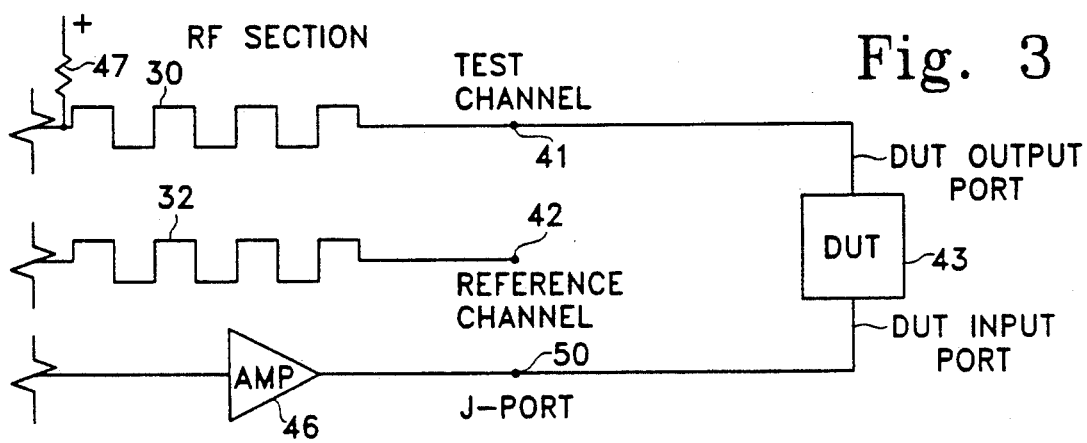
FIG. 3 is a block diagram of the connections made to measure the transmission coefficient of a device under test.

Referring to FIG. 3, the transmission coefficient of a DUT 43, such as a microwave network or device, can be measured when the output port of the DUT 43 is connected to the test channel 41 and the input port of the DUT 43 is connected to the J-Port 50. The signal flows from the input port to the output port of the DUT 43. If the DUT 43 is usually biased during its operation in a circuit, it should be properly biased during measurement of the transmission coefficient by connecting the proper port of the DUT 43 to the DC bias source 47. If the DUT has more than two ports the ports not of immediate interest are terminated by 50 ohm impedance and ignored. A three port network, for example, might be tested from port 1 to port 2, ignoring port 3, and then tested from port 3 to port 2, ignoring port 1, etc.

A. The Radio Frequency (RF) Section

Figure 4:
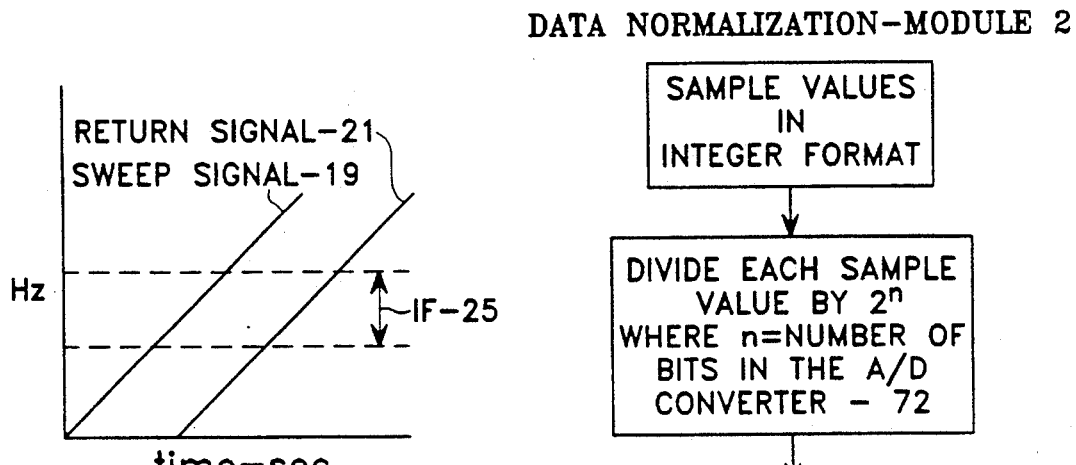
FIG. 4 is a graph illustrating the transmitted frequency sweep signal and the received, or return, signal, both used in determining the RIF or TIF frequency.

Referring to FIG. 1, in the upper left-hand corner is a voltage controlled oscillator (VCO) 18 that generates the original signal consisting of a sine wave sweep signal having a frequency range, for example, of from about 0.70–1.4 gigaHz and a sweep time of about 100 milliseconds (msec). Referring to FIG. 4, there is shown a graph of a typical sweep signal 19 generated by the VCO 18 with frequency displayed on the vertical axis and time displayed on the horizontal axis. Displaced later in time is the return signal 21 (to the right of the sweep signal). When the sweep signal 19 and the return signal 21 are mixed in the mixer, they generate an intermediate frequency 25, defined by the difference in frequency between the sweep signal 19 and the return signal 21 at any moment in time. The generation of IF signals illustrated in FIG. 4 applies to both the reference channel and test channel signals.

A nonlinear tuning voltage is applied to the varactor-tuned VCO 18 through line 20 from the digital section 16. The VCO 18 itself exhibits a nonlinear frequency-voltage response. This characteristic is compensated for by exciting the VCO 18 with a tuning voltage that itself is nonlinear in such a manner as to counter the nonlinear response of the VCO 18, thereby producing a substantially linear RF sweep signal over time, as shown in FIG. 4. Other frequency ranges and sweep times are of course available to the designer if desired.

The tuning voltage is supplied by the filtered output for the digital-to-analog (D/A) converter 22, which is filtered through the low pass filter 27, as described in detail below. The tuning voltage is a voltage ramp signal.

The RF signal from the VCO 18 is split into two smaller and equal signals by the 3 dB coupler 23, and these two signals are transmitted to the mixers 24, 26. The coupler 23 is designed to couple effectively over a range of frequencies that are matched to the design sweep frequencies. The mixers 24, 26 are double balanced mixers designed for service over the frequency sweep. Other components could be chosen for different frequency bands. The local oscillator (L in the Figures) ports and the reference, or RF, (R in the Figures) ports of the mixers 24, 26 are isolated from one another by about 30–40 dB.

In the network analyzer 10, however, less isolation is desired in the mixer 26, which is used to measure the reflection coefficient of the reference line termination, so the isolation is reduced by continuously injecting a DC bias into the intermediate frequency (IF) port of the mixer 26 through the resistor 28. As a result, the RF signal suffers a round trip delay through the delay line 32 and mixes with the transmitted signal to produce an IF signal that is approximately a sine wave with a frequency proportional to the time delay and sweep rate. The reference line termination is normally an open or short circuit, i.e. reflection coefficient = +1 or −1 respectively.

In contrast, the mixer 24 is similarly biased only when the network analyzer 10 is used to measure the reflection coefficient of the DUT. While a reflection coefficient is being measured, the normally open switch 34 is closed by a 1-bit signal from the buffer 36 transmitted on line 37, which applies a DC voltage to the resistor 38, which in turn creates a DC biasing current on the IF port of the mixer 24. This biasing reduces the isolation between the L and R ports of the mixer 24.

When the transmission coefficient of the DUT is being measured, the switch 34 is opened by the absence of the signal from the buffer 36 and the mixer 24 is not biased, maintaining the isolation between the L and R ports. As a result, the delay produced by the delay line 30 is a one way delay and the frequency of the TIF signal is nominally half that of the RIF.

The bias currents applied to the IF port of both mixers 24, 26 must be accurately determined to provide a peak or near peak IF output signal. The bias currents should be determined empirically for each network analyzer because the optimal bias current depends on the characteristics of individual circuit components.

The R ports of the mixers 24, 26 are connected to the delay lines 30, 32, respectively, through the fixed attenuators, or pads 40, which are used for impedance matching. Usually, it is desirable to use attenuators and delay line cables as close to 50 ohms as possible, but in some applications, notably work with cable television, 75 ohms is preferred. The value of the pads 40 may be, e.g., 6 dB.

The delay lines 30, 32 may be, e.g., simply lengths of coaxial cable, a linear phase shifter, a combination of a coxial cable and linear phase shifter, or any other appropriate device which produces a time delay. The performance of the network analyzer is substantially determined by the characteristics of the delay lines. Cable impedance, impedance uniformity, attenuation, and delay will determine the amount of "garbage signal" and the ultimate RF frequency resolution which equals $\frac{1}{2}\tau$ where $\tau$ is the time delay of the line. Attenuation of a signal caused by a delay line increases with increasing frequency, decreasing diameter and, of course, increasing time delay. Cable attenuation is primarily due to the resistance (ohmic loss) in the conductors.

Recent advances in superconducting technology promise delay lines of long delay, small size, but little attenuation. Materials with high transition temperatures could provide dramatic performance at a reasonable cost.

For many applications, a single delay line could be used in theory. In practice, however, very small changes in the operating characteristics of electronic circuits due to changes in temperature, line voltage, etc., may introduce errors into the measurements being made. The network analyzer 10 eliminates or reduces these types of errors by comparing the reference signal produced from delay line 32 during the measurement of the unknown DUT with the reference signal produced during the measurement of the calibration DUT.

The transmission coefficient of a DUT can be determined only by transmitting a test signal through the DUT. The network analyzer 10 transmits the test signal through the DUT by making the RF sweep signal available at the J-Port 50 and connecting the J-Port 50 to the input port of the DUT, as illustrated in FIG. 3. To achieve this result, a part of the RF signal is sampled by the directional coupler 44, amplified by the RF amplifier 46, attenuated by the pad 48 and is available at the J-Port 50 of the power channel, which is used to provide power to a DUT for measurement of the transmission coefficient, from which it is fed to the input port of the DUT. The output port of the DUT is connected to the test channel 41. The coupler 44 does not need to split the signal equally between the delay line 32 and the amplifier 46. Rather, the power splitter may favor the delay line because the RF amplifier 46 can boost the signals to the necessary level. RF power is made available to the J-Port 50 by turning on the RF amplifier 46 through a 1-bit switching signal from the buffer 36, which is transmitted on the line 52. The RF amplifier 46 is normally off.

The mixer 24 mixes the VCO frequency sweep RF signal with the received RF signal from the test channel 41 to produce an IF signal. The mixer 26 mixes the frequency sweep RF signal with the received RF signal from the reference channel 42 to produce a different IF signal. Both IF signals are in the neighborhood of 700 Hz, a frequency that can be readily processed by inexpensive conventional circuitry.

The IF signal from the mixer 24 is available on line 53. The If signal from the mixer 26 is available on the line 55.

B. The Analog Section

The analog section 14 primarily cleans up and amplifies the IF signals from the RF section so that only strong, clean signals are processed by the digital section 16. That is the analog section 14 is a means for conditioning the IF signals prior to digitizing in the digital section 16. The analog section 14 consists of two identical sets of circuits—one for the IF signal from the mixer 24 and one for the IF signal from the mixer 26, i.e., one for each channel. Therefore, only one discussion is presented, but it naturally applies to both circuits in the analog section 14.

The IF signal from the mixer 24, or 26 is transmitted to the amplifier 54 through the capacitor 56, which acts as a DC blocker, then to the programmable digital attenuator (PDA) 58, which controls the gain. The PDA 58 is controlled by a 3-bit signal produced by the computer 64 and transmitted along the data bus 76 through the buffer 36, where the signal is stored.

The attenuator IF signal is then conducted through the high pass filter 60, with a cutoff frequency of about 200 Hz, to reduce the low-frequency spurious signals due to short-range leakage and reflections of the microwave signals within the system. Modified elliptic high pass filters give sufficient rejection, at least 40 dB, and, at the same time, good transient response. Then the signals are passed through the low pass filter 62, with a cutoff frequency of about 1,000 Hz. Fourth-order elliptic low pass filters provide a minimum rejection of 40 dB in the stop band. The cutoff frequency in the low-pass filtering prevents aliasing by ensuring that the sampling rate (3.5 kHz) will be more than twice as great as the frequency of the analog signals. At this point the IF analog signal is relatively free of spurious signals, has an appropriate amplitude and is ready to be digitized and processed further in the digital section 16.

C. The Digital Section

Still referring to FIG. 1, the digital section 16 comprises two basic circuits, one for performing the analog to digital conversion of the signals from the mixers 24, 26, which are processed by the analog section 14, (shown in the upper left-hand portion of the digital section 16) and one for ramp signal generation to provide the signal for stimulating the VCO 18 (shown in the lower right-hand portion of the digital section 16). They will be discussed in that order.

1. The analog-to-digital conversion. The IF signals originating in the mixers 24, 26 are conducted from the low pass filters 62, 62 into the sampler and multiplexer 66 along lines 68, 70, respectively. The sampler and multiplexer 66 samples the incoming signals in time-division multiplexing at 3.5 kHz and forms interleaved samples of the TIF and RIF. The interleaved samples, still in analog form, are transmitted to the 12-bit analog-to-digital converter (A/D) 72, where the analog signals are converted to digital signals. The most significant 8-bits and the least significant 4-bits are time-division multiplexed in the A/D converter 72 and fed to the FIFO memory 74. The control circuit 75, i.e., the gate, controls the flow of serial data through bolt the A/D converter 78 and the FIFO memory 74. The data bits are stored in the FIFO memory 74 until they can be transferred through the bi-directional data bus 76 to the parallel-to-serial converter 78, which converts the input data from parallel to serial format for subsequent transmission to the computer 64, via lead 79 where the input signals are manipulated by the computer 64 and custom software to provide the final output at the display 65. The computer 64 also includes a keyboard or other appropriate data entry interface for the user. The display 65 is a conventional cathode ray tube screen coupled with a dot-matrix printer, but it may also be an LCD screen, a plotter, any type of printer, a combination of these devices, or any other type of display.

As an alternative to sampling and multiplexing the RIF and TIF signals, parallel data paths may be provided, with a separate A/D converter for the signals from each of the two mixers 24, 26. This alternative is significantly more expensive than the preferred embodiment disclosed herein.

The parallel-to-serial-converter 78 is used in the embodiment disclosed herein so that the serial port of the computer 64 can be used for the transfer of data into and out of the computer 64. Alternatively, the parallel port, which has faster data transfer, could be used. Similarly, direct memory access could be employed, as an alternative to using the memory devices 36, 74, 80, 82.

2. The ramp signal generation. To generate a linear sweep frequency from the nonlinear VCO 18, the inverse frequency-voltage characteristic of the VCO 18 is stored in the FIFO memory 80, from which it is fed to the D/A converter 22 in the form of a voltage ramp signal, and then through the low pass filter 27, which smooths the stepwise signal from the D/A converter 22. The duration of the frequency sweep is controlled by an 8-bit word generated by the computer 64 and stored in the buffer 82. The data sequence for the sweep signal, i.e., the words stored in FIFO 80, are also generated by the computer.

Both the sweep signal and the sweep duration control word are downloaded to the digital section 16 serially, converted to parallel format in the converter 78 and written to the FIFO 80 and the buffer 82 through the bi-directional data bus 76. The FIFO 74 contains the interleaved data from the digitized RIF and TIF. The computer reads this data via the data bus 76 and the serial-to-parallel converter 78.

Clock pulses are generated by the clock 88, which is located on the digital section 16 circuit board and is separate from the internal computer clock. The clock 88 may be a crystal-controlled 3.5 MHz source having suitable internal frequency dividers for generating specific lower frequency clock signals and an external frequency divider, such as the programmable frequency divider 87. The clock 88 is the master timer for the digital section 16. One of the outputs from the clock 88 also provides the clock pulses for the A/D converter 72. The clock 88 also drives the programmable frequency divider 87, which can be programed to provide the desired frequency signal on output lead 89, which in turn drives the control circuit 86, i.e., gate, that controls the flow of data bits through the FIFO memory 80. Using a master clock to drive both the D/A converter 22, which generates the frequency sweep signal, and the A/D converter 72, which handles the test data sampling, synchronizes the frequency sweep signal to the VCO 18 with the sampling of the IF signals. Synchronizing these two operations is essential for the recovery and measurement of signal phase information.

Clock signals derived from the computer clock could be used to drive the digital section 16. This would require either using a computer having a certain predetermined clock speed, or customizing the clock pulses from any computer to achieve the clock frequency required for operation of the digital section 16 of the network analyzer 10. It is contemplated that the network analyzer 10 can be conveniently connected to any computer the ultimate user selects, so an independent clock used only to drive the digital section of the network analyzer was chosen.

The handshake lines 84, operating through the microprocessor controlled serial-to-parallel converter 78, perform at least the following functions. They transmit control signals that 1) initiate the sweep signal to the VCO 18; 2) control the selection of a device to receive certain signals, e.g., the buffer 36 and the FIFO memory 80; and 3) issue read/write signals to the buffers and the FIFO memories. To initiate a sweep signal to stimulate the VCO 18, the computer 64 activates one of the handshake lines 84 that is connected to the control circuit 86, i.e., the gate, causing data from the FIFO memory 80 to be clocked out at a rate determined by the frequency sweep control word. The control circuit 86 stops clocking when the FIFO memory 80 is empty. The output of the D/A converter 22 is thus the desired nonlinear voltage ramp of programmable width, which is required to force the non-linear response to the VCO 18 to produce a linear frequency sweep.

II. THE COMPUTER SOFTWARE

The digitized data generated by the reference channel 42 intermediate frequency (RIF) and the test channel 41 intermediate frequency (TIF) are processed in the computer by the computer program, or software. Any computer selected by the end user may be employed. A personal computer employing an Intel 8088 microprocessor and the standard disk operating system (MS-DOS) by Microsoft Corporation was employed in the actual reduction to practice. The applications software was written in BASIC and compiled BASIC. Naturally, the applications software can be written in any desired language such as a high level programming language and may be used in any desired form, such as compiled or machine language, for any desired computer operating system. Programming languages are typically very different from one another, as are operating systems. Therefore, this description is limited to the flow charts of the program and modules that were developed to implement the network analyzer. A programmer skilled in the art can readily prepare code to implement the necessary steps in the computer language most convenient to a particular operating environment.

A. The General Organization of the Software

The software includes programs for performing four primary tasks: (1) calibrating the network analyzer for measurement of a reflection coefficient; (2) measuring the reflection coefficient of a DUT; (3) calibrating the network analyzer for measurement of a transmission coefficient; and (4) measuring the transmission coefficient of a DUT. The software further includes twelve separate utility modules for performing specific tasks that arise during execution of one or more of the four primary tasks. These utility modules remain in the background and are invoked by the primary programs as needed.

This description discusses the twelve utility modules first and then the four primary programs in the order listed above.

B. The Utility Modules

1. The input-output module

Figure 5:
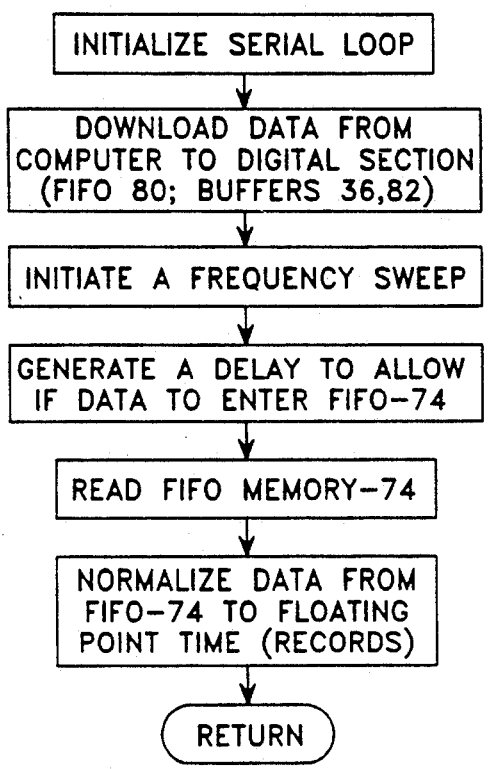
FIG. 5 is a flow chart of the input/output software module.

Referring to FIG. 5, the input/output (I/O) module begins by initializing the serial loop. Then, in "Downloading," the data is downloaded from the computer to the digital section components, including the FIFO 80, and the buffers 36, 82. The downloaded data includes an 8-bit word that determines the sweep duration and a separate 8-bit word that determines the attenuator settings for the PDAs 58, 58 (each of which is controlled by a separate 3-bit signal within the 8-bit word, which are transmitted via the buffer 36), whether the mixer 24 (test channel) is biased or not biased, and whether the amplifier 46 in the line to the J-Port 50 is on or off. Also downloaded is the data sequence to the D/A converter 22 that produces the non-linear ramp voltage for the VCO 18.

"Initiate a frequency sweep" triggers the release of data from the FIFO memory 80, which stimulates the VCO 18 to produce the linear frequency sweep.

"Generate a delay" delays all further action in the digital section 16 to allow the IF data from both the reference channel 42 and the test channel 41 to accumulate in the FIFO memory 74.

"Read FIFO 74" causes the computer to read the interleaved data in the FIFO memory 74, which is further time multiplexed in the form of 4-bit and 8-bit words. The output of the I/O module is these data words from the FIFO memory 74, that, when manipulated by the computer 64, will provide the user with the final output data on the display 65.

2. The data normalization module

Figure 6:
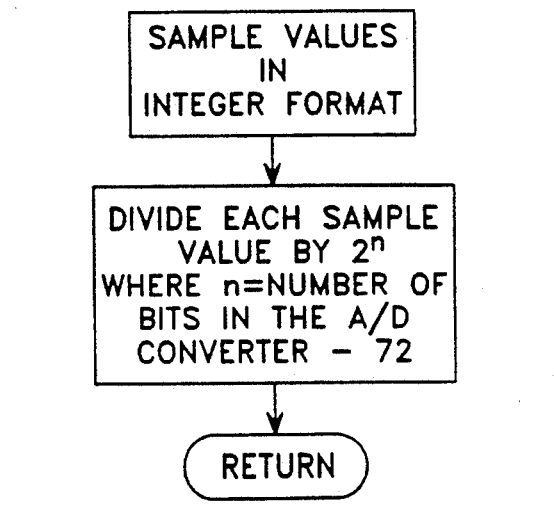
FIG. 6 is a flow chart of the data normalization software module.

Referring to FIG. 6, this module normalizes the data by dividing each sample value of the IF signal by a constant number of value $2^n$, where n is the number of bits in the A/D converter. This converts the data sequence from integer to floating point format. The input of this module is the output from the I/O module discussed above.

3. The ramp data generation module

Figure 7:
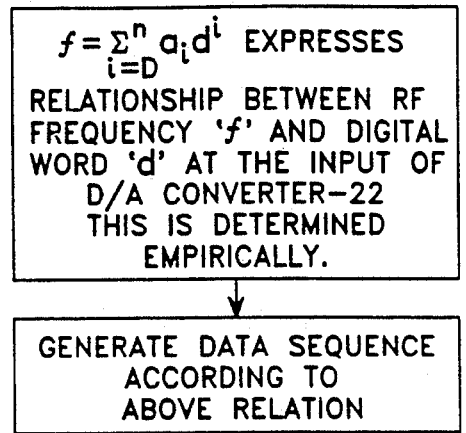
FIG. 7 is a flow chart of the ramp data generation software module for producing the frequency sweep signal.

Referring to FIG. 7, the inputs to this module are the minimum and maximum frequencies desired for the linear sweep for driving the VCO 18, the polynomial describing the relationship between the frequency response to the VCO 18 and the 8-bit word in the FIFO memory 80 that ultimately drives the VCO 18. The relationship between the microwave frequency and the 8-bit word at the D/A input is best determined empirically. The output of this module is the sequence of 8-bit data words to be stored int he FIFO 80 for output through the D/A converter 22 and the low pass filter 27. The output of the D/A converter 22, i.e., the voltage ramp signal, must be nonlinear in such a manner as to effect the frequency to voltage characteristics of the VCO 18 so that the output signal of the VCO 18 is a substantially linear frequency sweep between the minimum frequency and the maximum frequency.

When a straight line frequency sweep signal is directed through the DUT or at the DUT, the IF is directly proportional to the time delay of the return signal. To exploit this property, it is naturally important that the initial frequency sweep signal be as nearly a straight line sweep as possible. Ideally, the sweep would form a perfectly straight line, but this is difficult to achieve. As currently realized, however, the network analyzer can tolerate a deviation of about 1% from a straight line frequency sweep signal from the VCO 18 and produce accurate test results.

4. The analytic signal generation module

Figure 8:
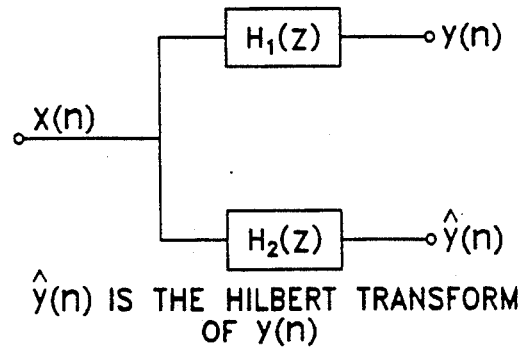
FIG. 8 is a flow chart of the analytic signal generation software module.

Referring to FIG. 8, this module uses a software filter to achieve a Hilbert Transform of the input signals. Any filter can be implemented either in electrical circuity (hardware) or in software. The network analyzer disclosed herein employs software filters in all filtering functions that are not described in the hardware discussion (Section I) to reduce component cost and increase flexibility. Improved performance of the network analyzer can be achieved by implementing the filters in firmware, i.e., as software permanently encoded in a nonvolatile ROM.

The input of this module is the real array {XX}, which is a time record from either the test channel or the reference channel. The outputs of this module are the real arrays {Y1} and {Y2} such that {Y2} is the Hilter Transform of {Y1}. These arrays are related to the transmission or reflection coefficient of a DUT as a function of microwave frequency.

The implementation of the Hilbert Transform designed for the network analyzer 10 uses two software IIR filters realized by second and third-order difference equations.

The Hilbert transform can be implemented either as a FIR or an IIR filter. The important considerations in choosing one method over the other are computation efficiency, accuracy, noise performance, and transient response. The FIR realization achieves the exact 90 degrees phase shift of the ideal Hilbert transformer, but the flat unity magnitude response is approximated by equiripple characteristics. On the other hand, the IIR realization is a perfect all pass filter with a ripple in the ideal 90 degrees phase shift characteristic. For a specified accuracy, the FIR implementation usually requires more computation that the IIR implementation. The IIR allows the DC voltage offset to pass unaltered, and this appears as noise to the output signal. The FIR, however, suppresses the DC offset, and thereby creates less error in the analytic signal. The IIR implementation was chosen for the network analyzer described here because it requires less computation, while still yielding satisfactory results. An implementation of the network analyzer using a more powerful computer might provide superior results by using a FIR filter.

5. The arithmetic functions module

Figure 9:
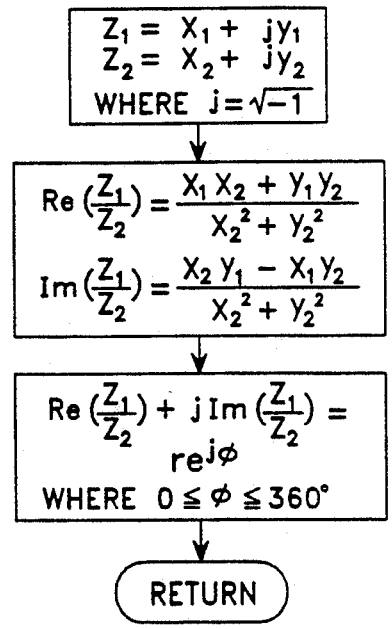
FIG. 9 is a flow chart of the arithmetic functions software module.

Referring to FIG. 9, this module implements the complex division of two complex numbers $Z_1$ and $Z_2$ in Cartesian coordinate form and the output is the ratio $Z_1/Z_2$ in Cartesian form. This ratio is then converted to polar coordinate form with the phase angle determined unambiguously between 0 and 360 degrees.

6. The garbage subtraction module

Figure 10:
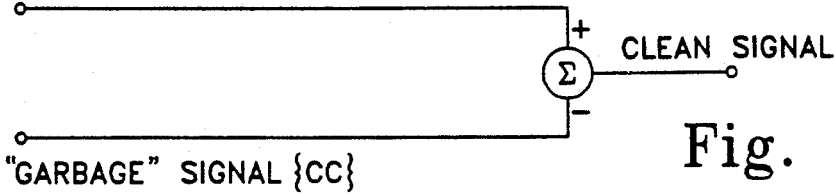
FIG. 10 is a flow chart of the garbage subtraction software module.

Some small coherent signals exist at the IF output which are unrelated to the DUT. This is termed "garbage." Referring to FIG. 10, the garbage subtraction module takes as its inputs the real array {XX}, which is a normalized test channel time record, and the real array {CC}, which is a normalized test channel time record when the test channel itself is terminated by a matched device. The output is the real array {XX} = {XX} − {CC}.

Both the IF signals, i.e., TIF and RIF, include a component resulting from the DUT and a component resulting from signals generated in the delay line preceding the DUT. The signal component due to the DUT is the desired signal. The signal component due to delay line imperfections, discontinuities, etc. which are generated in the line preceding the DUT have been termed "garbage signal." The method of removing the signal has been described previously as "garbage subtraction." A matched impedance termination was used to measure this undesired signal so it could be subtracted.

There exists an alternative method for removing the undesired, or "garbage" signal without the use of a matched impedance. This alternative method involves either analog or digital filtering of the IF signal.

Let us treat the Fourier transform of the TIF signal so that the data resulting is now only a function of the delay time. Signals arriving at the delay line delay are due to the DUT and will be retained. All signals arriving at times less than the delay of the DUT are "garbage signals." These can be removed if the DUT is nondispersive. Thus, with an open circuit alone, the "garbage signal" can be determined.

Alternatively, the IF frequency of any signal is directly proportional to the time delay associated with that signal. Thus, we can use filtering (either analog or digital) to separate the DUT signal from the "garbage signal." Analog filtering is desirable if a large "garbage signal" limits the dynamic range of the measurement. The filtering of TIF before digitizing maximizes the measurement of dynamic range.

7. The high pass digital filter module

Figure 11:
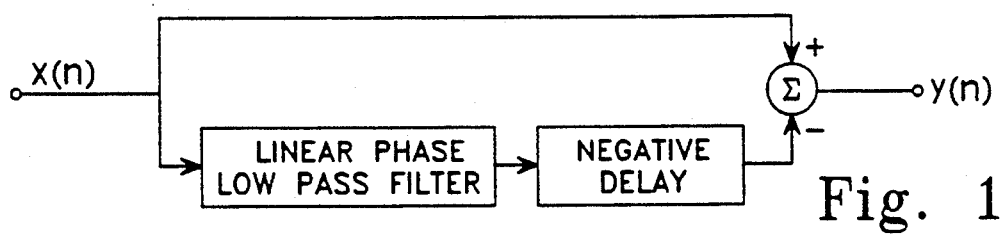
FIG. 11 is a flow chart of the high pass digital filter software module.

Referring to FIG. 11, this module is a software implemented linear phase FIR high pass filter employing the matched delay subtraction technique, in which a linear phase low pass filter is realized and therefore the delay introduced is precisely known as an integral multiple of clock cycles. The low pass filter data is shifted backwards to offset the effect of delay, and is subtracted from the original data record to perform a high pass filtering. The linear phase low pass filter was realized using a window with Kaiser weighting.

The module consists of two parts. The first part comprises the computation of coefficients subroutine, using the cut off frequency (the sampling frequency is 3.5 kHz) and the number of taps. The output of this part of the module consists of the coefficients of the low pass filter of the above cut off frequency.

The second part of the module is the matched delay subtraction filtering subroutine. This subroutine takes as its inputs the real array {XX} and generates a real array {XX} output consisting of the high pass filtered version of the input.

8. The frequency computation module

Figure 12:
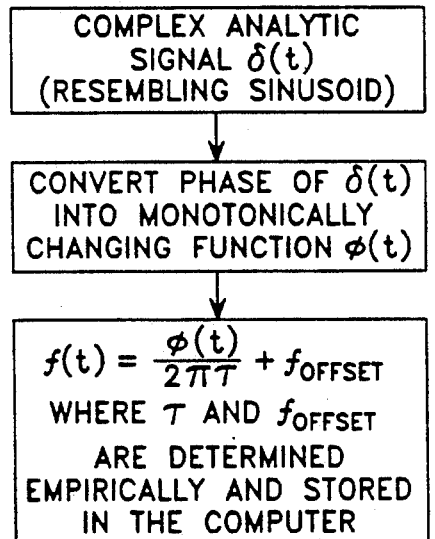
FIG. 12 is a flow chart of the frequency computation software module.

Referring to FIG. 12, this module takes as its inputs the complex array representing the analytic signal in the reference channel and the time delay of the delay line in the reference channel, which is determined empirically. The output is an array whose values are proportional to the microwave frequencies corresponding to each sample in time.

This module converts the phase of the analytic signal into a monotonic function by adding or subtracting, as appropriate, 360 degrees. This monotonic phase is divided by (360 degrees) ($\tau$) where $\tau$ = time delay of the delay line, and an offset that is added to account for the ambiguous (360 degrees) (i) term, where i is an integer.

9. The interpolation module

Figure 13:
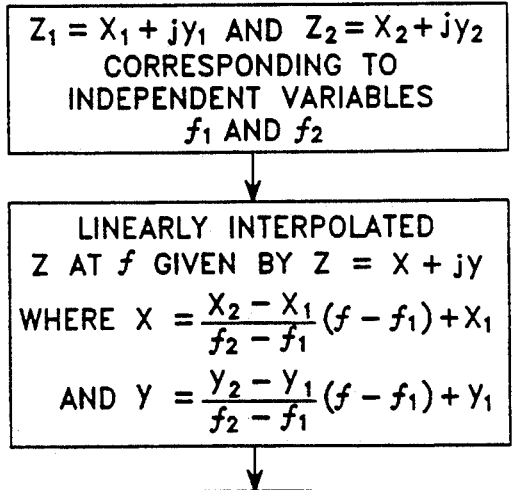
FIG. 13 is a flow chart of the interpolation software module.

Referring to FIG. 13, this module is used during measurement of the transmission coefficient (described in greater detail below), where the test channel has a single-trip delay because the frequency sweep signal passes through the test channel delay line 41 only once, and the reference channel has a round-trip delay because the sweep signal must travel to the terminal end of the reference delay line 42 and back to its beginning. This module is not used during measurement of a reflection coefficient.

The inputs of this module are the complex array $\delta_{1R}(t)/\delta_{2R}(t)$ where $\delta_{1R}(t)$ is the equivalent complex analytic signal of the RIF during calibration, and $\delta_{2R}(t)$ is the equivalent complex analytic signal of the RIF during a measurement; the microwave frequencies at each time instant for a round trip delay (computed by module 8, frequency computation); the microwave frequencies at each time instant for a single trip delay (computed by module 8).

The outputs are the magnitude of $\delta_{2R}(t)/\delta_{2R}(t)$ computed at microwave frequencies corresponding to single trip delay and phase corrections computed at microwave frequencies corresponding to single trip delay.

The outputs of this module are computed in Cartesian coordinate form by linear interpolation of input complex data. Then it is converted to polar form and the output $\delta_{1R}(t)/\delta_{2R}(t)$ at microwave frequencies corresponding to the single trip delay are obtained. The phase angle is corrected by a correction factor of $\tau_R/\tau_T$ to get the final output, where $\tau_R$ = round trip delay, and $\tau_T$ = single trip delay.

10. The group delay module

Figure 14:
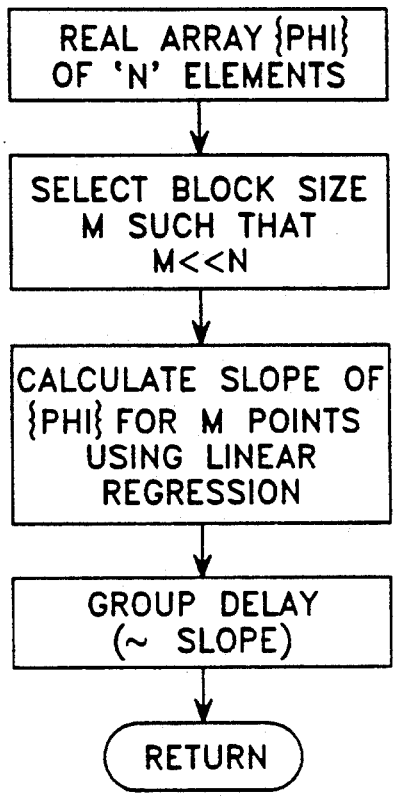
FIG. 14 is a flow chart of the group delay software module.

Referring to FIG. 14, the inputs of this module was the real array of microwave frequencies and the real array of the phase angle of the reflection or transmission coefficient. The outputs are the real array of group delay as a function of another real array, i.e., microwave frequency.

Mathematical differentiation of the phase record with respect to microwave frequency creates noise as the numerator and denominator become small quantities comparable to their uncertainties. For this reason, the phase and frequency arrays were divided into blocks of equal size. The size of the block is a small number that the user can select. The phase and frequency characteristics of each block are assumed to be linear, and linear regression was used to compute the slope (and therefore the group delay) of each block. The user is given a further option of smoothing the data by a low pass filter, which is identical to the low pass filter in the high pass digital filter module (module 7). Any high frequency component outside the IF bandwidth can thus be filtered out.

11. The fast fourier transform module

Figure 15:
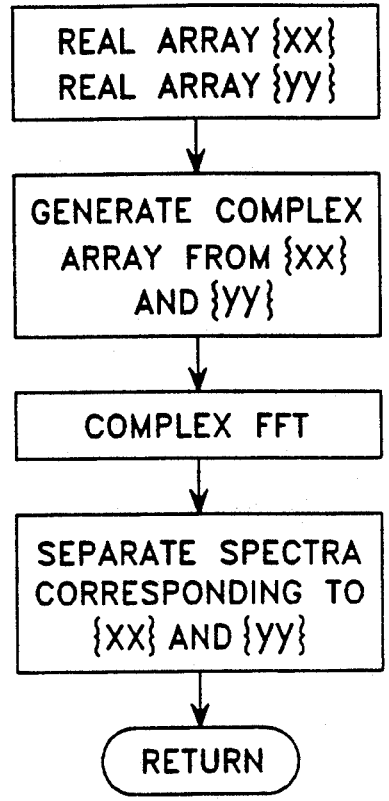
FIG. 15 is a flow chart of the fast Fourier transform software module.

Referring to FIG. 15, this module takes the two real arrays and performs a fast Fourier transform for the data in both of the arrays. These arrays are related to the transmission or reflection coefficient of a DUT as a function of time delay.

12. The display module

Figure 16:
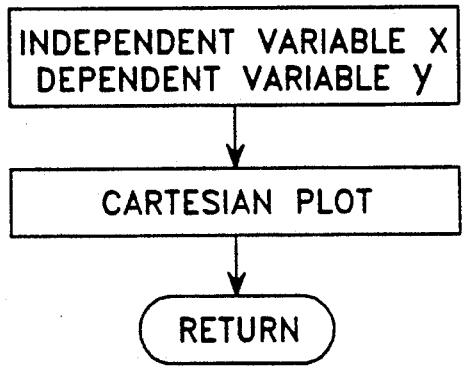
FIG. 16 is a flow chart of the display software module.

Referring to FIG. 16, the display module accepts two real arrays, $\{X\}$ and $\{Y\}$ and provides and X,Y plot with suitable titles, graphics, etc. for display on the screen and for producing hardcopy on the printer. The $\{X\}$ array may be microwave frequency, while the $\{Y\}$ array may be any of the following: the magnitude of the reflection coefficient or the transmission coefficient, depending on which measurement the user has made; the phase of reflection or transmission coefficient; or the group delay.

When $\{X\}$ is the transform frequency (or time delay), the $\{Y\}$ frequency is the magnitude or phase of the spectrum. When $\{X\}$ is time, $\{Y\}$ is the voltage of the IF waveform. Smith Chart and polar representations are also possible.

C. The Functional Routines

The modulus discussed immediately above are invoked as needed to generate a reflection coefficient and a transmission coefficient. Each of these two routines requires its own calibration routine. They will be discussed in the following order: (1) measurement of reflection coefficients, including subroutines for calibration and measurement; and (2) measurement of transmission coefficients, including subroutines for calibration and measurement. Before discussing the specific design of the software, a few comments regarding calibration of the network analyzer in general are presented. These comments apply to calibration for measurements of both the reflection coefficient and the transmission coefficient.

1. General remarks about calibration

As notes above, when a linear frequency sweep is used as the signal in a network analyzer or a radar, the IF frequency transmitted is directly proportional to the time delay of the return signal. Further, the IF signal includes amplitude and phase modulation, which depends upon the frequency characteristics of the DUT. Therefore, demodulation of the signal gives complete information about the transfer function. When the sweep is not perfectly linear, the carrier frequency undergoes additional phase modulation due to the nonlinearity and this unwanted phase modulation must also be accounted for. The amplitude of the sweep may also vary with RF frequency and must be accounted for.

An ideal delay line would simplify implementation of a network analyzer using the above principles. In practice, however, an ideal delay line is difficult to achieve. In addition, imperfections exist in the couplers, mixers, and other components, which introduce variations in amplitude and phase as a function of RF frequency. Such variations, however, can be corrected by appropriate calibration procedures. The calibration procedures discussed below assume initially that: (1) the characteristics of the passive components, e.g., the mixers, couplers, and delay lines, do not change appreciably between calibrations; 2) the VCO frequency drift is less than $\frac{1}{2}\tau$, resulting in an unambiguous phase drift; and 3) the frequency sweep and IF sampling remain synchronized.

All characteristics of interest in the DUT, e.g., magnitude and phase as a function of frequency, can be determined through the calibration process. If the VCO output is absolutely stable no reference channel is necessary, but this condition is not attainable in a practical implementation. Therefore, to implement the calibration procedure, both the test channel and the reference channel are required. For calibration, the DUT is replaced by a standard and the time waveform is recorded. For reflection coefficient calibration, the calibration device may be an open circuit or a short circuit. For transmission coefficient measurement, a through connection may be used.

Further, the time delays in the reference channel and the test channel may not be identical. This introduces a phase error term, which can be eliminated through mathematical manipulation. The processing techniques permit characterizing the frequency dependent complex system function completely, based only on four time records. This method has the following advantages over conventional frequency domain measurements: (1) no amplitude leveling of the VCO output is necessary; (2) no phase locked sources (oscillators) are necessary because the frequency is computed from the information about the total phase and the time delay.

Figure 17:
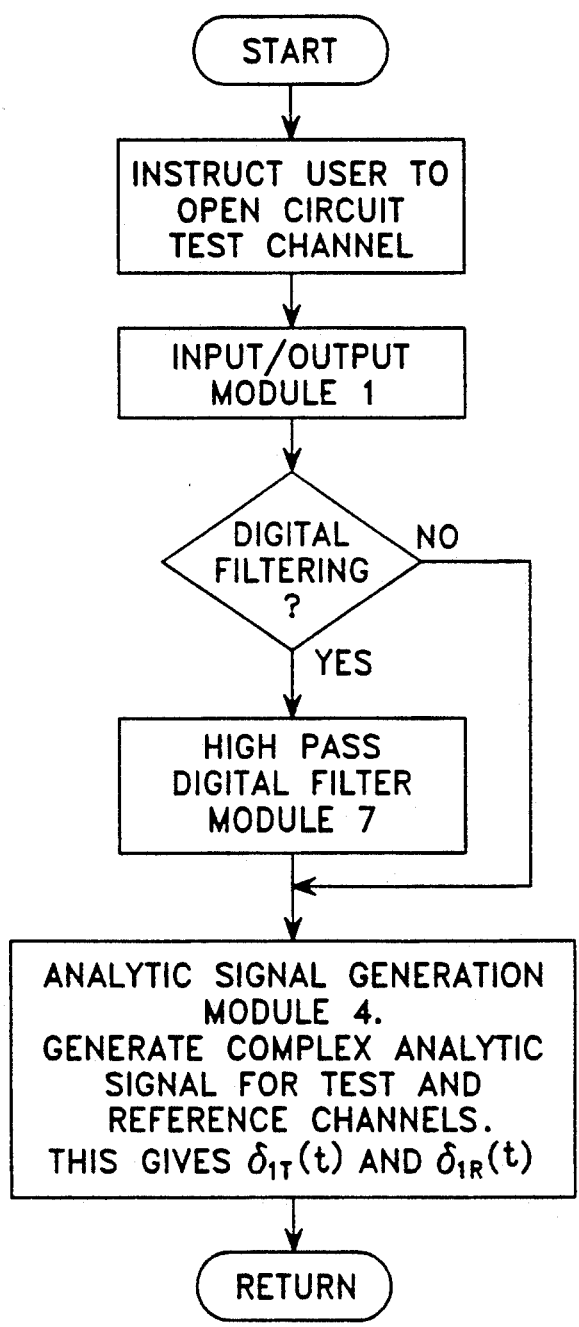
FIG. 17 is a flow chart of the software for calibration of the network analyzer to prepare it for measurement of a reflection coefficient.

2. Measurement of reflection coefficients a. Calibration. Referring to FIG. 17, there is shown the simplified flow chart for the software that calibrates the network analyzer 10 in preparation for measuring a reflection coefficient ("reflection coefficient routine"). The reflection coefficient subroutine begins with "start," which provides a suitable user message on the display 65 instructing the user to create an open circuit in the test channel. This routine then invokes "the input/output module 1," which initiates the frequency sweep and gathers the data from the test and reference channels. If the user requires a high-pass digital filtering to be performed, the test channel waveform is filtered. Next, "the analytic signal generation module 4" is invoked to perform the Hilbert transform and analytic signals corresponding to the test and reference channels are generated. When module 4 has completed its work, this routine returns to the main program.

The functional steps performed by the reflection coefficient routine are: (1) instructing the user to open the test channel circuit; (2) initiating a frequency sweep signal; (3) recording the IF signals from both the test channel and the reference channel; (4) converting the IF data into complex analytic signals, with one signal train for the test channel, $\delta_{IT}(t)$, and one for the reference channel, $\delta_{1R}(t)$; and (5) computing the instantaneous frequency associated with each sample.

b. Actual measurement of the reflection coefficient

In general, the reflection coefficient is measured by connnecting one port of the DUT 43 to the test channel at 41 and terminating the other port with the proper impedance. The sweep frequency signal generated by the VCO 18 is transmitted through the DUT. The primary function of all the subsequent circuitry and computer hardware and software is comparing the transmitted sweep frequency signal with the return signal from the DUT. The computer section 17 is charged with analyzing the comparison signal (TIF) to develop the reflection coefficient.

The reflection and transmission coefficients can both be measured for each port of a multiport DUT. A transfer switch permits the reflection coefficient and the transmission coefficient of a DUT to be measured without disconnecting the DUT and turning it around. This is accomplished by switching the electrical connections to the DUT. The switching may be manually or electronically controlled.

Figure 18:
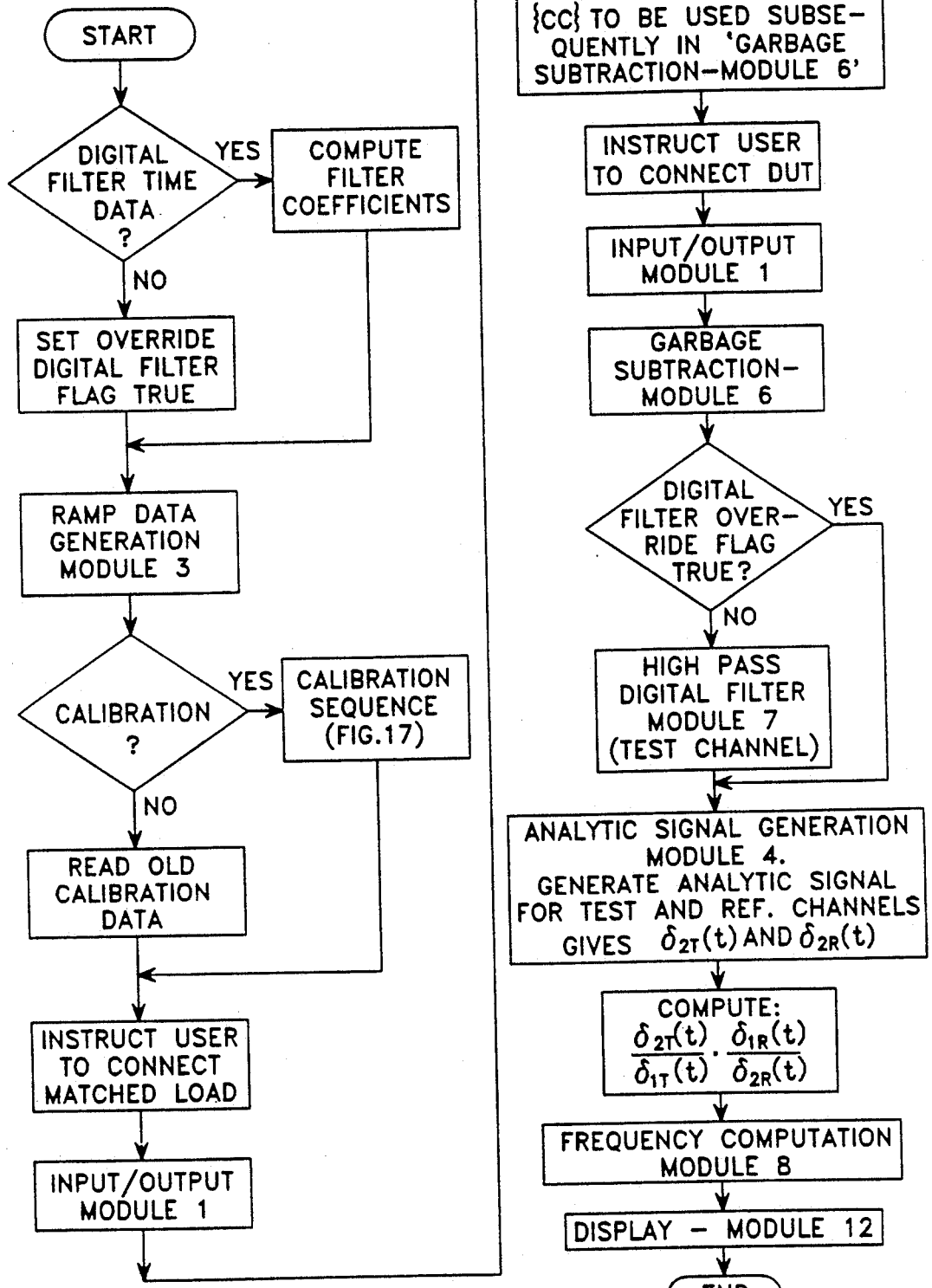
FIG. 18 is a flow chart of the software for measurement of a reflection coefficient.

Referring to FIG. 18, there is shown the simplified flow chart for the software for measuring the reflection coefficient. This routine "Starts" when the user decides to measure a reflection coefficient. Then the computer asks the user if digital filtering is requested, which is answered yes or no. If filtering of the time data is desired, the "compute filter coefficients" subroutine is invoked to calculate the filter coefficients. If no filtering of the time data is desired, the computer "sets the override digital filter flag true," causing the data to fall through to the next subroutine without any calculation of the filter coefficients.

In either case, this routine next invokes the "Ramp data generation" module 3 to produce the data sequence that is used to stimulate the VCO 18. The "Calibration" subroutine, which is invoked next, offers the user the option of recalibrating the network analyzer through an appropriate prompt on the display. If the user declines, the network analyzer reads the old calibration data, which was stored following the prior calibration. If the user chooses to recalibrate, the reflection calibration subroutine, discussed immediately above, is invoked before the software proceeds to the next subroutine.

Next, "Instruct user to connect a matched load" prompts the user to connect the test channel to a matched impedance. The I/O module 1 is called and the time data from the test channel comprises the "garbage signal." The program then issues another user prompt, "Instruct user to connect DUT," and "the I/O module 1" is invoked again to test the DUT. The "garbage 1" is subtracted from the test channel time data to get the cleaned-up time data. This cleaning-up takes place in the "garbage subtraction module 6."

The "Digital filter override flag true?" subroutine checks to determine whether the user has elected to use or not to use the high pass digital filter. If the flag is not true, "the high pass digital filter module 7" is invoked. If the flag is true, the high pass digital filter is skipped and the program proceeds to the next step.

The "generate analytic signal module 4" is invoked to generate the analytic signals for both test and reference channels. The next subroutine, "Compute $\dfrac{\delta_{2T}(t)}{\delta_{1T}(t)} \cdot \dfrac{\delta_{1R}(t)}{\delta_{2R}(t)}$"

further manipulates the analytic signals and yields the reflection coefficient. Then "the frequency computation module 8" is called to obtain the RF frequency corresponding to each time sample. Results from the previous two routines are passed to he display 65 through "the display module 12." The display may be a graph or chart, or it may be an alphanumeric display of desired information, or both. If desired, the output may be converted to the time domain through Fourier transforms, which can be calculated by calling module 11, "the fast Fourier transform 11." The result of this module is the reflection coefficient as a function of time delay.

3. Measurement of transmission coefficient a. Calibration. The steps involved in calibrating the network analyzer to measure a transmission coefficient are listed as follows:

1. Create an open circuit in the test channel.
2. Initiate a frequency sweep.
3. Record the IF signals from the reference channel, and not from the test channel.
4. Convert the IF data into a complex analytic signal by using module 4," $\delta_{1R}(t)$.
5. Connect the J-Port of the network analyzer to the test port of the network analyzer to create a through connection.
6. Initiate a frequency sweep at nominally twice the normal sweep rate to compensate for the one-way delay time in the test channel, as opposed to the round trip delay encountered in the reference channel.
7. Record the IF signal from the test channel only.
8. Convert the IF data from the test channel (step 7) into complex analytic signals by invoking "the analytic signal generation module 4," $\delta_{1T}(t)$.
9. Compute the frequency corresponding to each instant of time according to module 8.

Figure 19:
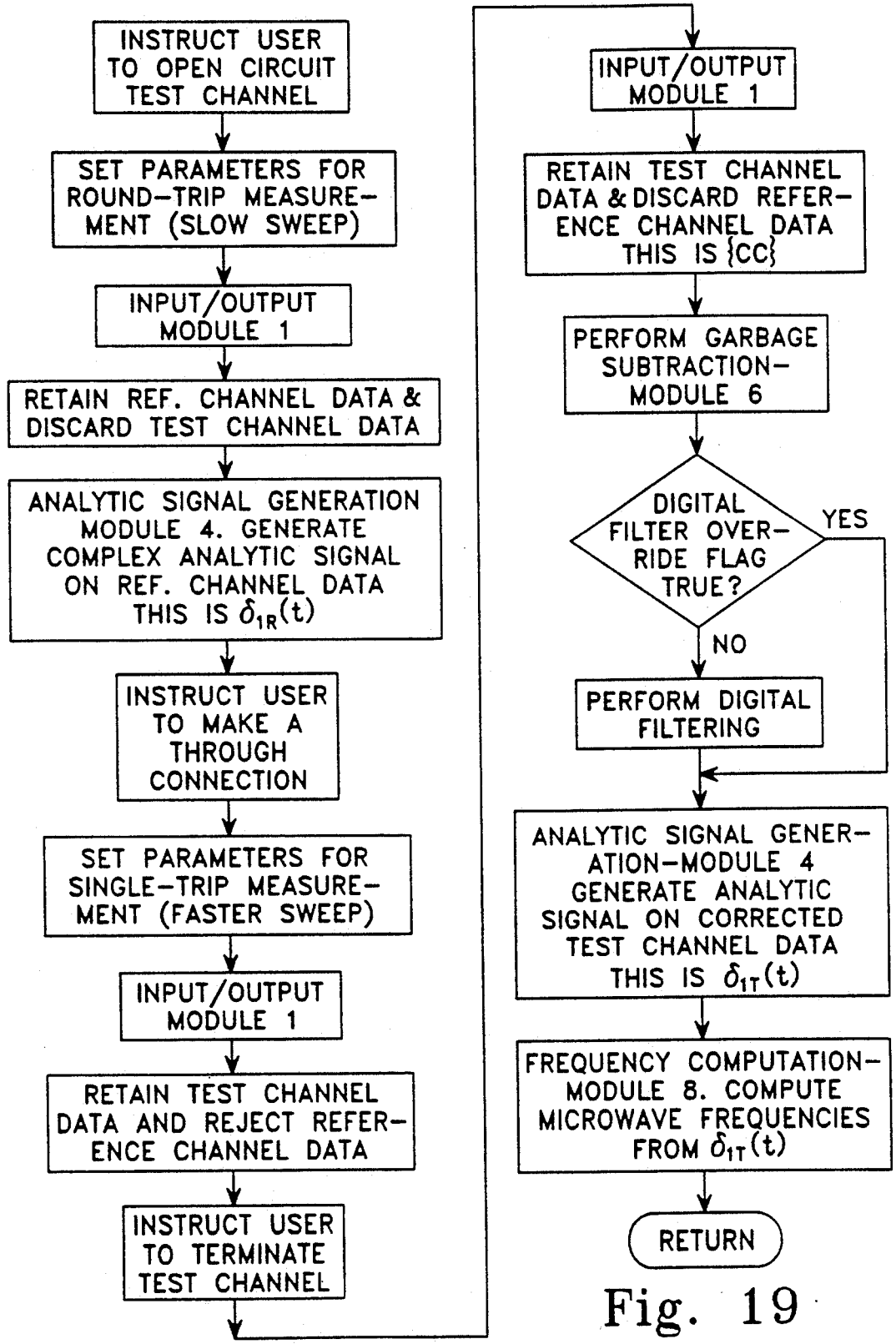
FIG. 19 is a flow chart of the software for calibration of the network analyzer to prepare it for measurement of a transmission coefficient.

Referring to FIG. 19, there is shown a simplified flow chart illustrating the implementation of the foregoing steps by the computer program. The "Calibration for Measurement of a Transmission Coefficient" subroutine begins with the "Instruct user to open circuit test channel" subroutine, which prompts the user to create an open circuit at the end of the test channel. The "Set parameters for round trip measurement (slow sweep)" subroutine enables the computer to enter the appropriate parameters corresponding to round-trip delay. Then "the I/O module 1" is invoked and the reference channel data is retained by the next subroutine, "Retain reference channel data and discard test channel data."

Complex analytic data is produced from the reference channel data by "the analytic signal generation module 4." The output is stored and the "Instruct user to make a through connection" subroutine prompts the user to connect the Test port to the J-Port as described in step 5 above. Again, the computer sets parameters, this time by the "Set parameters for single trip measurement (Faster sweep)" subroutine, to generate a faster sweep for the one-way trip the signal takes through the test channel delay line, as compared with the round-trip, or two-way, delay encountered in the reference channel. Then "the I/O module 1" is called again to gather data from the IF signals. In the next subroutine, "Retain test channel data and reject reference channel data," the data from the test channel is saved and the data from the reference channel is discarded. Then "Instruct user to terminate test channel" prompts the user to terminate the test channel with an impedance of appropriate value. "The I/O module 1" is invoked to generate the frequency sweep again. Then the test channel data is again stored while the reference channel data is discarded by the "Retain test channel data and discard reference channel data" subroutine. The data is now the real array {CC}, which includes the "garbage signal." These data are then treated by "the garbage subtraction module 6."

Next, the computer checks the "Digital filter override flag" which has been set by the user either to bypass the digital filtering or to perform it by invoking "the high pass digital filter module 7." In either event, the signals are next manipulated by "the analytic signal generation module 4" using the corrected test channel data.

Finally, "the frequency computation module 8" is invoked to compute the RF frequencies corresponding to each time sample, "return" subroutine returns the system and the user to the main program, where testing of DUTs can be conducted.

b. Actual measurement of the transmission coefficient. The actual measurement of the transmission coefficient is performed by implementing the following steps in the software:

1. Connect the DUT and feed power to its input port through the J-Port 50.
2. Initiate a frequency sweep signal at nominally twice the normal sweep rate to compensate for the one-way delay through the test channel delay line, as compared to the round trip delay through the reference channel.
3. Record the IF signal for the test channel only, and not from the reference channel.
4. Convert the IF data from the test channel into a complex analytic signal, $\delta_{2T}(t)$.
5. Open circuit the test channel.
6. Initiate a frequency sweep signal at the normal rate, i.e., about one-half the rate of step 2 immediately above.
7. Record the IF signal from the reference channel only, and not from the test channel.
8. Convert the IF data from the reference channel into a complex analytic signal, $\delta_{2R}(t)$.
9. Compute the frequency corresponding to each instant of time from the complex analytic signals from both the reference channel and the test channel.
10. Determine the system drift between the time of the DUT measurement and the calibration measurement by the ratio $\delta_{1R}(t)/\delta_{R2}(t)$.
11. Interpolate the values of the ratios from step 10 to correspond to frequencies calculated from the test channel frequencies, $\delta'_{1R}(t)/\delta'_{2R}(t)$.
12. Apply correct phase corrections to the interpolated values for the ratios found in step 11, to account for the unequal delays in the test and reference channels," $\delta''_{1R}(t)/\delta''_{2R}(t)$.
13. Calculate the transmission coefficient, which is done by multiplying the ratios by the correction factors for each frequency, $$\frac{\delta_{2T}(t)}{\delta_{2T}(t)} \cdot \frac{\delta_{1R}(t)}{\delta_{2R}(t)}.$$

14. If desired, convert the data into time domain data by invoking "the fast Fourier transform 11." The result of this module is the transmission coefficient as a function of time delay.

Figure 20:
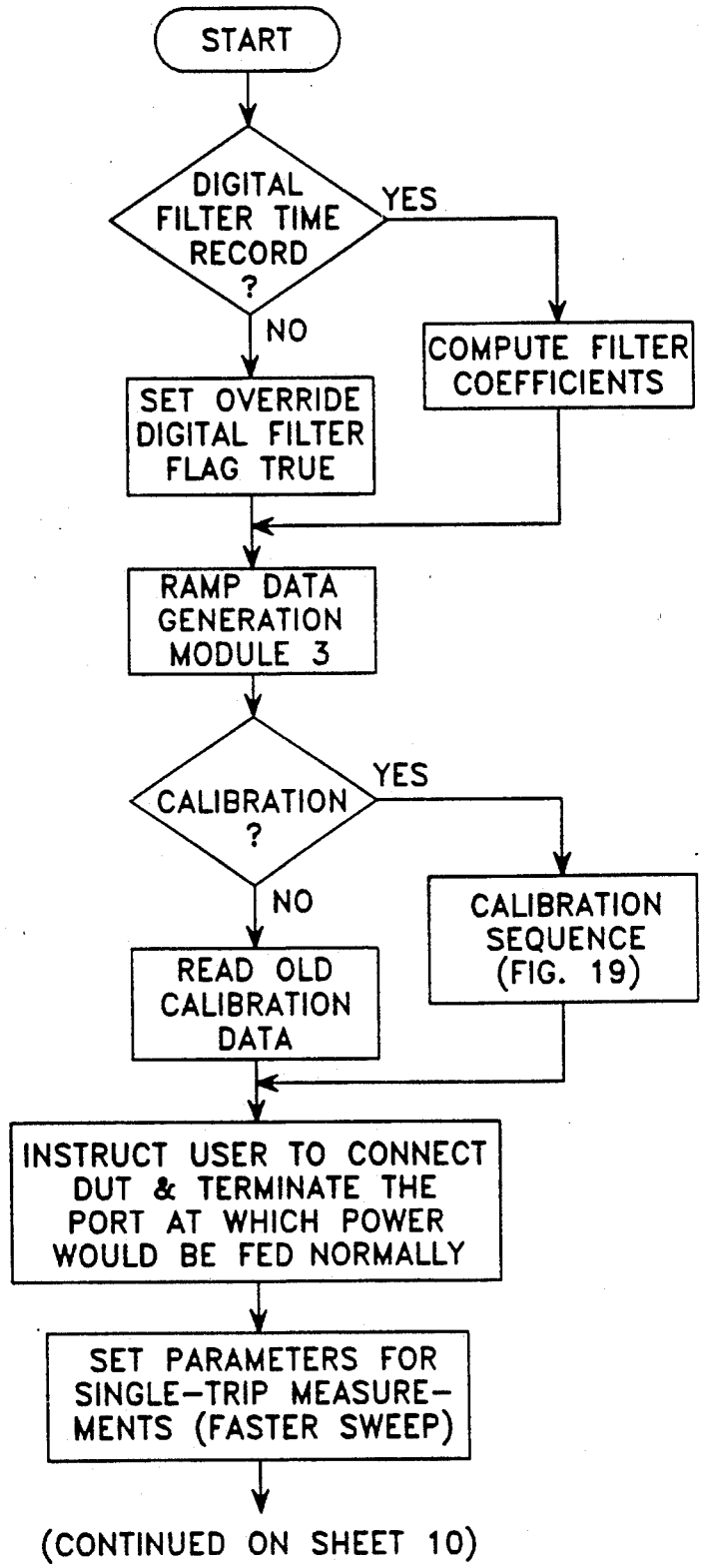
FIG. 20 is a flow chart of the software for measuring a transmission coefficient.
Figure 20:
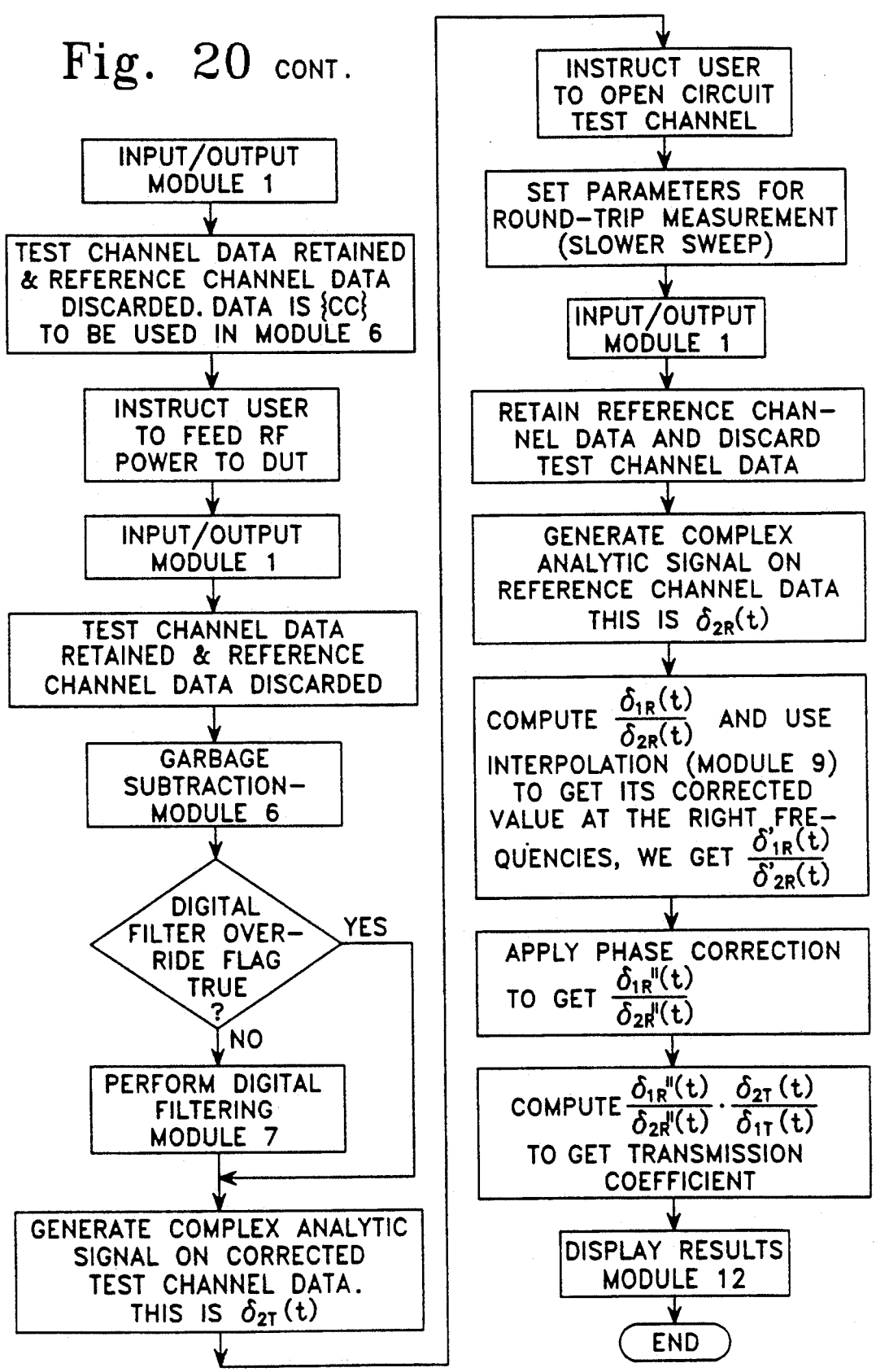

Referring to FIG. 20, there is shown a simplified flow chart illustrating the implementation of the foregoing steps by the computer program. The "Measurement of Transmission Coefficient" subroutine begins with the "Start" subroutine, which prompts the user to enter appropriate keystrokes to initiate a measurement. Then the computer asks the user if digital filtering is requested, which is answered yes or no. If filtering is desired, the program proceeds to the "Computer filter coefficients" subroutine. If no filtering of the data is desired, the computer sets the "override digital filter flag" true, causing the data to fall through to the next subroutine without any calculation of filter coefficients.

Next, "the ramp data generation module 3" is invoked to generate a data sequence to stimulate the VCO for the frequency sweep. The "Calibration" subroutine then prompts the user and gives him the option of calibrating the network analyzer for measurement of transmission coefficients. If the user chooses to calibrate, the program invokes the "Calibration sequence," discussed immediately above. If the user chooses not to calibrate prior to measurement of the transmission coefficient, the program reads the calibration data stored earlier and moves to "instruct the user to connect DUT and terminate the port at which power would normally be fed (input port)."

The "Set parameters for single trip measurement (faster sweep)" subroutine enables the computer to generate a faster sweep corresponding to the one-way delay in the test channel, as compared with the round trip delay in the reference channel. "The I/O module 1" is invoked to initiate the sweep and gather the data generated. Test channel data is retained and reference channel data is discarded. The data are now in the form of the real array {CC} and ready to be entered into the "garbage subtraction module 6." The next subroutine, "Instruct user to feed RF power to the DUT," prompts the user to feed RF power to the input port of the DUT from the J-Port 50. The frequency sweep is then initiated and data gathered by invoking the "I/O module 1." The test channel data is retained and reference channel data is discarded. Then "the garbage subtraction module 6" is invoked to clean up the resulting signals.

Next, the "digital filter override flag" is checked to determine whether the user has chosen to perform digital filtering or not. If the flag is true, the filtering subroutine is skipped. If the override flag is not true, "the high pass digital filter module 7" is invoked to filter the data.

Then "the analytic signal generation module 4" is invoked to generate $\delta_{2T}(t)$. When this module has completed its work, the "instruct user to open the circuit test channel" subroutine prompts the user to crease an open circuit in the test channel and to confirm his action in the computer. The program then sets parameters for round trip measurement (slower sweep). The "I/O module 1" is invoked to initiate a frequency sweep and gather data. The reference channel data is retained and test channel data is discarded. Using this data, originally from the reference channel, the program invokes "the analytic signal generation module 4", to generate $\delta_{2R}(t)$.

From the analytic signal, the program moves to the "Compute the ratios $\delta_{1R}(t)/\delta_{2R}(t)$. The "interpolation module 9" is invoked to generate the ratio $\delta'_{1R}(t)/\delta'_{2R}(t)$ at test channel frequencies. Next, phase correction at each frequency is made to account for the unequal lengths of test and reference channels, and the ratio $\delta''_{1R}(t)/\delta''_{2R}(t)$ is obtained.

Then the program moves to Compute, $$\frac{\delta_{1R}''(t)}{\delta_{2R}''(t)} \cdot \frac{\delta_{2T}(t)}{\delta_{1T}(t)}$$

which gives the transmission coefficient.

Finally, "the display module 12" is invoked to display the results. The display may be a graph or chart, or it may be an alphanumeric display of desired information, or both. If desired, the output may be converted to the time domain through Fourier transforms, which can be calculated by calling "the fast Fourier transform module 11." Naturally, the display may be printed, transmitted, or otherwise manipulated to suit the needs of the user.

While the invention and certain embodiments have been disclosed herein in accord with the statutes, the scope of the invention should be limited only by the claims that follow.

Having thus described the invention, what is claimed as new and desired to be secured by Letters Patent is:

1. A vector network analyzer comprising:
   (a) a radio frequency section having one and only one RF oscillator for generating an output RF sweep frequency signal, means for displaying said RF signal prior to its transmission to a device under test (DUT), and means for mixing a return RF signal from the DUT with the initial RF sweep frequency signal to produce an analog intermediate frequency (IF) signal;
   (b) means for converting said analog IF signal to digital signals prior to further processing and analyzing of said analog signals; and
   (c) means for processing and analyzing said digital signals to determine a reflection coefficient or a transmission coefficient.

2. A vector network analyzer in accordance with claim 1 wherein said RF section further comprises means for splitting said sweep frequency RF into at least two channels, said two channels further comprising a reference channel and a test channel, and a signal delay means in each said channel.

3. A vector network analyzer in accordance with claim 2 wherein said converting means further comprises means for sampling and means for multiplexing the IF signal from said reference channel with the IF signal from said test channel; means for converting said signals from analog signals to digital signals.

4. A vector network analyzer in accordance with claim 3 further comprising a clock for generating clock pulses, means for driving said sweep frequency generating means and means for driving said analog to digital converting means synchronized with said clock pulses.

5. A vector network analyzer in accordance with claim 1 wherein said processing and analyzing means further comprises means for processing and analyzing said digital signals in the phase domain.

6. A vector network analyzer in accordance with claim 5 further comprising means for applying a direct current bias to a DUT.

7. A vector network analyzer in accordance with claim 1 further comprising means for generating a voltage ramp signal for driving said RF oscillator.

8. A vector network analyzer in accordance with claim 7 wherein said oscillator further comprises a varactor regulated voltage controlled oscillator (VCO) having a non-linear frequency response and said sweep frequency generating means generates a non-linear sweep frequency signal for exciting said VCO such that the output of said VCO is a linear sweep of frequencies over time.

9. A vector network analyzer in accordance with claim 8 wherein said sweep frequency generating means further comprises a means for producing a stream of digital signals, means for converting said digital signals to analog signals, and means for transmitting said analog signals to said RF oscillator.

10. A vector network analyzer in accordance with claim 1 further comprising means for processing said digital signals in the phase domain.

11. A vector network analyzer in accordance with claim 1 wherein said mixing means further comprises one and only one said mixer for said reference channel and one and only one separate said mixer for said test channel.

12. A vector network analyzer in accordance with claim 1 wherein said digital signal processing means further comprises means for calibrating said signals.

13. A vector network analyzer in accordance with claim 12 wherein said digital signal processing means further comprises means for correcting errors in said signal.

14. A vector network analyzer comprising:
   (a) a radio frequency (RF) section having one and only on RF oscillator for generating an RF sweep frequency signal; means for splitting said RF signal into at least two channels, said two channels further comprising a test channel and a reference channel; means for delaying said RF signals in said test channel and in said reference channel; means for splitting said RF signal in said reference channel into a reference channel signal and a power signal channel; means for mixing said RF signal to said reference channel with the return signal from said reference channel; and means for mixing the RF signal to said test channel with the return signal through said test channel and from a device under test (DUT) to produce an analog intermediate frequency from said reference channel (RIF) and an analog intermediate frequency for said test channel (TIF);
   (b) a digital circuit section responsive to said RF section and comprising means for converting said RIF and said TIF signals from analog to digital signals prior to further processing and analyzing of said analog signals;
   (c) means for processing and analyzing said digital signals, said processing and analyzing means further comprising computer hardware and software; and
   (d) means for generating a voltage ramp signal for driving said RF oscillator.

15. A vector network analyzer in accordance with claim 14 wherein said RF section further comprises means for DC biasing of said DUT.

16. A vector network analyzer in accordance with claim 15 wherein said voltage ramp generating means further comprises means for generating a digital ramp voltage signal, means for converting said signal from digital to analog form and means for transmitting said signal to said RF oscillator for exciting said RF oscillator.

17. A vector network analyzer in accordance with claim 14 wherein said conversion means further comprises means for sampling said RIF and said TIF and means for multiplexing said sampled RIF and TIF signals.

18. A vector network analyzer in accordance with claim 14 further comprising means for conditioning said RIF and TIF signals, said conditioning means further comprising an analog circuit section having separate circuit channels for the RIF and TIF, each said circuit channel comprising in series an amplifier, an attenuator and high and low pass filters.

19. A vector network analyzer in accordance with claim 14 wherein said processing and analyzing means further comprises means for processing and analyzing said digital signals in the phase domain.

* * * * *